United States Patent
Hirasawa et al.

(10) Patent No.: US 7,015,631 B2
(45) Date of Patent: Mar. 21, 2006

(54) TUNING-FORK TYPE PIEZO-OSCILLATOR PIECE AND MOUNTING METHOD THEREOF

(75) Inventors: Kazuya Hirasawa, Miyada-mura (JP); Seiichiro Ogura, Minowa-machi (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/916,602

(22) Filed: Aug. 12, 2004

(65) Prior Publication Data

US 2005/0062368 A1    Mar. 24, 2005

(30) Foreign Application Priority Data

Aug. 19, 2003  (JP)  .............................. 2003-295606
May 11, 2004  (JP)  .............................. 2004-141105

(51) Int. Cl.
*H03H 9/02* (2006.01)
(52) U.S. Cl. ....................................... 310/370; 333/200
(58) Field of Classification Search ................ 310/370; 333/200; 29/25.35
See application file for complete search history.

(56) References Cited

U.S. PATENT DOCUMENTS 6,724,271 B1 *  4/2004  Sakata et al. ................ 331/156
2005/0017604 A1 *  1/2005  Yamada ....................... 310/370

FOREIGN PATENT DOCUMENTS

| JP | A 54-58395 | 5/1979 |
| JP | A 56-85921 | 7/1981 |
| JP | A 56-85922 | 7/1981 |
| JP | A 57-185717 | 11/1982 |

* cited by examiner

*Primary Examiner*—Darren Schuberg
*Assistant Examiner*—J. Aguirrechea
(74) *Attorney, Agent, or Firm*—Oliff & Berridge, PLC

(57) ABSTRACT

Aspects of the invention can provide a tuning-fork type piezo-oscillator piece, whose package, in which the tuning-fork type piezo-oscillator piece is mounted, is protected from colliding with oscillating arms even though a physical shock is given onto the tuning-fork type piezo-oscillator piece, and a mounting method thereof. The tuning-fork type piezo-oscillator piece can include a tuning-fork type piezo-oscillator piece main body equipped with a plurality of oscillating arms, a short side part formed along a direction perpendicular to the longitudinal direction of the tuning-fork type piezo-oscillator piece main body and connected to the tuning-fork type piezo-oscillator piece main body, and a long side part formed along the longitudinal direction of the tuning-fork type piezo-oscillator piece main body, while starting from the short side part, and equipped with a shock-absorbing part.

10 Claims, 11 Drawing Sheets

FIG. 3B

Tuning-fork type piezo-oscillator relating to the present embodiment

Conventional type of tuning-fork type piezo-oscillator

TUNING-FORK TYPE PIEZO-OSCILLATOR PIECE AND MOUNTING METHOD THEREOF

BACKGROUND OF THE INVENTION

1. Field of Invention

Aspects of the invention relate to a tuning-fork type piezo-oscillator piece and a mounting method thereof, and especially relates to a tuning-fork type piezo-oscillator piece, which suitably protects its oscillator piece from getting damaged by physical shock, and a mounting method of the tuning-fork type piezo-oscillator piece.

2. Description of Related Art

Related surface mounting types of tuning-fork type piezo-oscillator pieces can include a structure, in which a plurality of oscillating arms are elongated from a base part; and another structure comprising a tuning-fork type piezo-oscillator piece main body, in which a plurality of oscillating arms are elongated from a base part, and a supporting part, which is connected to the base part and surrounds the tuning-fork type piezo-oscillator piece main body in a frame part. FIG. 4 and FIG. 5 are drawings to show tuning-fork type piezo-oscillator pieces according to related technologies. FIG. 4(a) and FIG. 5(a) are top views of the tuning-fork type piezo-oscillator pieces, while FIG. 4(b) and FIG. 5(b) are section views of the components, in which each corresponding tuning-fork type piezo-oscillator piece is mounted into a package. When a tuning-fork type piezo-oscillator piece 112 having a base part 110 and a plurality of oscillating arms 111 is mounted into a package 113, a connecting electrode placed at a bottom surface of the base part 110 and a package side mounting electrode 114 placed at the package 113 are fixedly connected with a conductive adhesive 115 (Refer to FIG. 4). Meanwhile, when a tuning-fork type piezo-oscillator piece 124 having a tuning-fork type piezo-oscillator piece main body 122, which consists of a base part 120 and a plurality of oscillating arms 121, and a supporting part 123 surrounding the tuning-fork type piezo-oscillator piece main body 122 in a frame part is mounted into a package 125, a plurality of connecting electrodes placed at both the ends of the supporting part 123 in its longitudinal direction and a plurality of package side mounting electrodes 126 placed at the package are fixedly connected with a conductive adhesive 127 (Refer to FIG. 5).

A certain type of tuning-fork type piezo-oscillator piece can have a structure including a base part, a plurality of oscillating arms, and an L-shape branch part formed by protrusion from the base part. See, for example, Japanese Unexamined Patent Publication No. 57-185717. Furthermore, there is another certain type provided with a structure, in which a tuning-fork type piezo-oscillator is constructed by connecting a case onto a supporting part of a tuning-fork type piezo-oscillator piece, comprising a tuning-fork type piezo-oscillator piece main body and the supporting part surrounding the tuning-fork type piezo-oscillator piece main body in a frame part, from the upper and lower directions with solder materials.

SUMMARY OF THE INVENTION

Incidentally, a tuning-fork type piezo-oscillator piece, having a base part and a plurality of oscillating arms, is supported only by two positions in a package. Therefore, it is sometimes impossible to mount the tuning-fork type piezo-oscillator piece in parallel with the bottom surface of the package. Consequently, in comparison with a case where the tuning-fork type piezo-oscillator piece is correctly mounted to be parallel, the tuning-fork type piezo-oscillator piece tilts either upward or downward to cause a problem of variations in mounting condition. Furthermore, when a tuning-fork type piezo-oscillator piece, comprising a base part and a plurality of oscillating arms, is supported only by two positions in a package, and when a tuning-fork type piezo-oscillator piece, comprising a base part, a plurality of oscillating arms and a supporting part, is mounted as described above; any strong physical shock caused onto the tuning-fork type piezo-oscillator piece due to dropping and so forth may sometimes make the tip of the oscillating arms collide with the package. Such a collision results in damages such as breaking and chipping of the oscillating arms to cause a problem of deterioration of the frequency performance of the tuning-fork type piezo-oscillator piece. Especially in recent years, tuning-fork type piezo-oscillator pieces are downsized and thinned to become fragile to physical shock.

Regarding the tuning-fork type piezo-oscillator piece described above, no explanation is given about mounting onto the package, and furthermore there seems no part that may absorb physical shock and so forth in the tuning-fork type piezo-oscillator piece. In the case of the tuning-fork type piezo-oscillator piece described in Japanese Unexamined Patent Publication No. 54-58395, the supporting part is sandwiched in the case so that there seems no part that may absorb physical shock.

The invention can provide a surface mounting type of tuning-fork type piezo-oscillator piece and a mounting method for the tuning-fork type piezo-oscillator piece, in which mounting is done in parallel with the package bottom surface and the oscillating arms are protected from colliding with the package.

A tuning-fork type piezo-oscillator piece of the invention can include a tuning-fork type piezo-oscillator piece main body equipped with a plurality of oscillating arms, a short side part, which is formed along a direction perpendicular to the longitudinal direction of the tuning-fork type piezo-oscillator piece main body, and is connected to the tuning-fork type piezo-oscillator piece main body, and a long side part, which is formed along the longitudinal direction of the tuning-fork type piezo-oscillator piece main body while starting from the short side part, and which is equipped with a shock-absorbing part. When a physical shock is given onto the tuning-fork type piezo-oscillator piece, the shock-absorbing part oscillates in the vertical direction while bending itself so that the physical shock can be lessened. Consequently, the tuning-fork type piezo-oscillator piece main body can be kept away from being shaken violently, but just gets moved slightly in the vertical direction so that there occurs no collision with the package. Therefore, the tuning-fork type piezo-oscillator piece main body can be protected from colliding with the package.

Furthermore, in the tuning-fork type piezo-oscillator piece, a mounting part is formed at a position in the long side part, which is located to be closer to the tip side of the plurality of oscillating arms than a center position of total gravity of the tuning-fork type piezo-oscillator piece main body, the short side part and the long side part. According to this structure, when having a physical shock, the shock-absorbing part bends itself initiatively and displacement of the tuning-fork type piezo-oscillator piece itself can be lessened so that the tuning-fork type piezo-oscillator piece can be protected from colliding with the package.

Still further, in the structure of the tuning-fork type piezo-oscillator piece, the long side part is elongated from the mounting part toward the tip side of the plurality of oscillating arms to be formed along the direction perpendicular to the longitudinal direction of the tuning-fork type piezo-oscillator piece main body so that a supporting part connected to the long side part is formed. In other words, the tuning-fork type piezo-oscillator piece is equipped with a frame part that surrounds the circumference of the tuning-fork type piezo-oscillator piece main body, and the long side part of the frame part is provided with a shock-absorbing part, meanwhile the structure has the supporting part in the short side part of the frame part on the tip side of the plurality of oscillating arms. Since the supporting part is formed, it becomes possible to mount the supporting part when the tuning-fork type piezo-oscillator piece is mounted onto the package base. Since the long side part is also mounted, the tuning-fork type piezo-oscillator piece is placed by mounting at least 3 positions. Therefore, it becomes possible to mount the tuning-fork type piezo-oscillator piece in parallel with the bottom surface of the package base. Also, when a physical shock is given onto the tuning-fork type piezo-oscillator piece, the shock-absorbing part oscillates in the vertical direction while bending itself so that the physical shock can be lessened. Then, the tuning-fork type piezo-oscillator piece main body just gets moved slightly in the vertical direction. Therefore, the tuning-fork type piezo-oscillator piece main body can be protected from colliding with the package.

Also, in the exemplary tuning-fork type piezo-oscillator piece, at least one of the width and the thickness of the shock-absorbing part can be formed so as to be thinner than the width and the thickness of each of the long side part. Moreover, the shock-absorbing part can even have a structure formed by providing the long side part with a hole part or an concave part. By designing the width and the thickness of the shock-absorbing part and the size of the hole part and the concave part according to the size of the tuning-fork type piezo-oscillator piece as well as the center position of gravity and so on, it becomes possible for the shock-absorbing part to lessen a physical shock when the physical shock is given onto the tuning-fork type piezo-oscillator piece.

Furthermore, in the tuning-fork type piezo-oscillator piece, a tip of the long side part is elongated along the direction perpendicular to the longitudinal direction of the tuning-fork type piezo-oscillator piece main body to form a short side part on the tip side of the plurality of oscillating arms and to have a mounting part at a bottom surface of the short side part. The mounting part comes to get located to be closer to the tip side of the plurality of oscillating arms than the center of gravity of the tuning-fork type piezo-oscillator piece. Therefore, the physical shock given onto the tuning-fork type piezo-oscillator piece can be lessened by the shock-absorbing part so that the tuning-fork type piezo-oscillator piece main body can be protected from colliding with the package.

Still further, in the tuning-fork type piezo-oscillator piece described above, a clearance between the plurality of oscillating arms and the long side part is wider than the amplitude, with which the plurality of oscillating arms oscillate, when a physical shock is given onto the tuning-fork type piezo-oscillator piece. In case a physical shock is given onto the tuning-fork type piezo-oscillator piece in the direction perpendicular to the surface of the tuning-fork type piezo-oscillator piece, the shock-absorbing part oscillates to lessen the physical shock and the oscillating arms also oscillate from side to side laterally. On this occasion, since the clearance between the plurality of oscillating arms and the long side part is wider than the amplitude, with which the plurality of oscillating arms oscillate, it is possible to avoid any collision between the oscillating arms and the long side part.

In addition, the long side part is furthermore provided with mounting at one more location at least. According to the mounting method, there exist at least 3 mounting positions and therefore, the tuning-fork type piezo-oscillator piece can be mounted in parallel with the bottom surface of the package base.

Moreover, in a mounting method for a tuning-fork type piezo-oscillator piece, the long side part is mounted at a position, which is located to be closer to the side of a plurality of oscillating arms than the center position of gravity of the tuning-fork type piezo-oscillator piece having a tuning-fork type piezo-oscillator piece main body that consists of a base part and the plurality of oscillating arms, a shock-absorbing part, and a supporting part, and meanwhile, the supporting part is mounted. According to the mounting method, when having a physical shock due to dropping, the base part side of the tuning-fork type piezo-oscillator piece gets displaced initiatively so that the oscillating arm side can be protected from colliding with the package.

BRIEF DESCRIPTION OF THE DRAWINGS

The invention will be described with reference to the accompanying drawings, wherein like numerals reference like elements, and wherein:

FIGS. 3A–3G are drawings for explaining modified examples of the tuning-fork type piezo-oscillator piece relating to the second exemplary embodiment;

DETAILED DESCRIPTION OF PREFERRED EMBODIMENTS

Figure 1A:
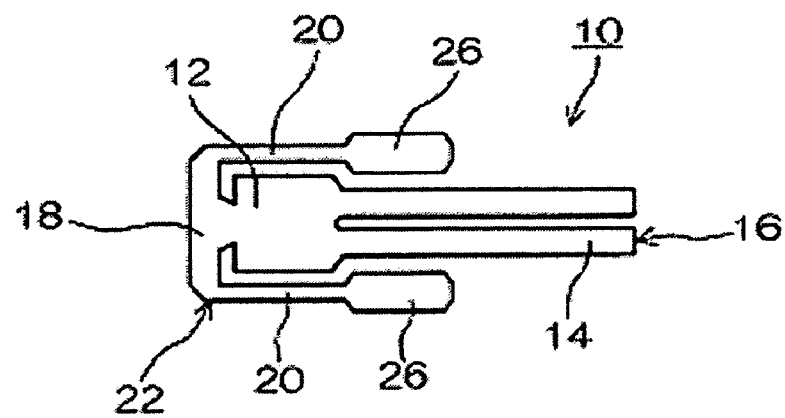
FIGS. 1A–1C are drawings for explaining a tuning-fork type piezo-oscillator piece and a tuning-fork type piezo-oscillator relating to a first exemplary embodiment.
Figure 1B:
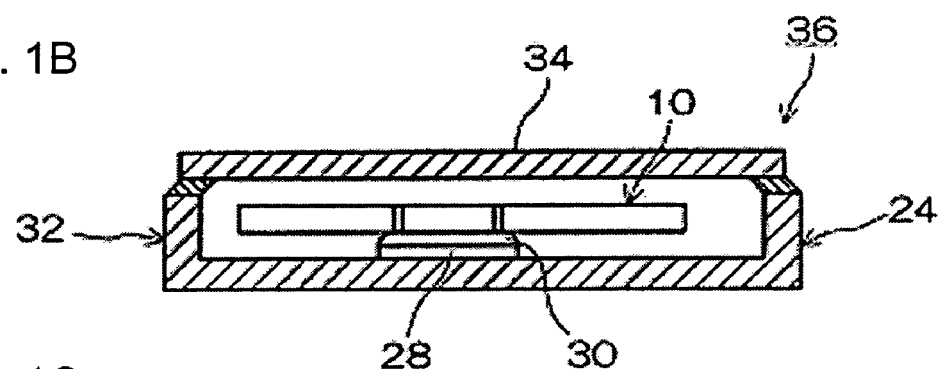
Figure 1C:
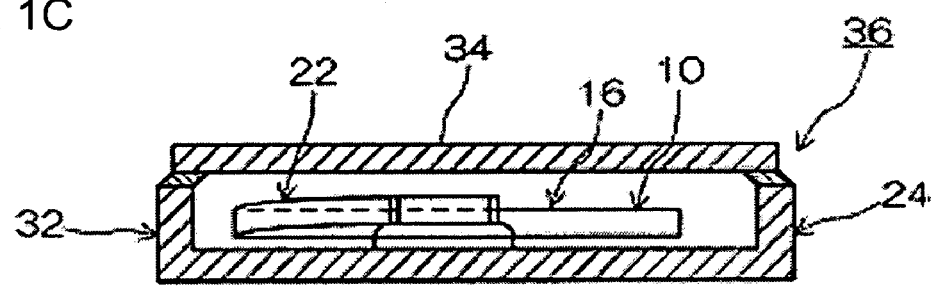

The following sections describe exemplary embodiments of the tuning-fork type piezo-oscillator pieces and mounting methods of thereof relating to the invention. What are described below are just some exemplary embodiments for example of the invention. Further, it should be understood that the invention is not confined to what are described below. A first exemplary embodiment is described at first. FIG. 1 shows drawings for explaining a tuning-fork type piezo-oscillator piece and a tuning-fork type piezo-oscillator relating to the first embodiment. FIG. 1A is a top view drawing of the tuning-fork type piezo-oscillator piece, and FIG. 1B is a cross section drawing of the tuning-fork type piezo-oscillator. Meanwhile, FIG. 1C explains how the tuning-fork type piezo-oscillator piece lessens a physical shock given onto the tuning-fork type piezo-oscillator.

A tuning-fork type piezo-oscillator piece 10 has a tuning-fork type piezo-oscillator piece main body 16, in which a plurality of oscillating arms 14 are elongated from an end of a base part 12. Connected to the tuning-fork type piezo-oscillator piece main body 16 is a shock-absorbing part 22 including a short side part 18, which is placed along the direction perpendicular to the longitudinal direction of the tuning-fork type piezo-oscillator piece main body 16, and a long side part 20, which start from both the ends of the short side part 18 and formed along the longitudinal direction of the tuning-fork type piezo-oscillator piece main body 16. A clearance between the oscillating arms 14 and the long side part 20 is formed to be wider than the amplitude, with which the oscillating arms 14 oscillate side to side laterally, when a physical shock is given onto the tuning-fork type piezo-oscillator piece 10.

The long side part 20 is equipped with a mounting part 26 for mounting the tuning-fork type piezo-oscillator piece 10 onto a package base 24. The mounting part 26 is formed at a position corresponding to the center position of gravity of the tuning-fork type piezo-oscillator piece 10 in its longitudinal direction, while a connecting electrode (not illustrated in the drawing) is formed at a bottom surface of the mounting part 26. The mounting part 26 is preferably located to be closer to the tip side of the oscillating arms 14 than a center position of gravity of the tuning-fork type piezo-oscillator piece 10, which are composed of the tuning-fork type piezo-oscillator piece main body 16, the short side part 18 and the long side part 20. Though the mounting part 26 is positioned at the tip of the long side part 20 in the structure of this embodiment, it is not necessarily required to have the mounting part 26 at the tip.

The shock-absorbing part 22 positioned between the mounting part 26 and the base part 12 has its thickness and width so adjusted as to have a function to lessen a physical shock when the physical shock is given onto the tuning-fork type piezo-oscillator piece 10.

Then, an exciting electrode (not illustrated in the drawing) is formed on the upper and lower surfaces of the tuning-fork type piezo-oscillator piece main body 16, and the exciting electrode and the forgoing connecting electrode are electrically continuous with each other by a leading electrode (not illustrated in the drawing) formed at the shock-absorbing part 22.

The tuning-fork type piezo-oscillator piece 10 having the structure described above can be mounted onto the package base 24 by fixedly connecting the connecting electrode placed at the mounting part 26 and a package side mounting electrode 28 formed on the package base 24 with an adhesive material 30. The adhesive material 30 can be a conductive adhesive material, a conductive sheet, a conductive film, a gold bump or a gold-tin brazing material and so on. Especially when a silicone-base conductive adhesive material is used, the heat resisting performance is improved and generating gas from the conductive adhesive material is controlled. Meanwhile, using a gold bump results in no gas generated, and therefore it is a suitable method for sealing a package 32 in vacuum condition. In case an electrical conductivity is not obtained as required, a bonding wire may be used to have a sufficient electrical conductivity. Then, a lid 34 is connected onto the upper end surface of the package base 24 by using a low-melting glass or by seam welding to construct a tuning-fork type piezo-oscillator 36.

Next, an action of the tuning-fork type piezo-oscillator piece 10 under a condition where a physical shock caused by dropping and so on is given onto the tuning-fork type piezo-oscillator 36. When being given onto the tuning-fork type piezo-oscillator 36, such a physical shock is transmitted to the tuning-fork type piezo-oscillator piece 10. Then, the tuning-fork type piezo-oscillator piece 10 gets oscillated by the physical shock, but the shock-absorbing part 22 provided with the function to lessen the physical shock mainly oscillates. In other words, when the physical shock is given onto the tuning-fork type piezo-oscillator piece 10, the shock-absorbing part 22 vertically oscillates, while bending itself by having the vibration center at the mounting part 26, to lessen the physical shock. Since the tuning-fork type piezo-oscillator piece main body 16 simply moves vertically at the time while keeping its posture being parallel with the bottom surface of the package base 24, there is no chance for the tuning-fork type piezo-oscillator piece main body 16 to collide with the package 32 (Refer to FIG. 1C). Also, there is no chance for the oscillating arms 14 and the long side part 20 to collide with each other.

In the structure described above; the shock-absorbing part 22 of the tuning-fork type piezo-oscillator piece 10 is provided with the function to lessen the physical shock so that there is no chance for the tuning-fork type piezo-oscillator piece 10 to collide with the package 32 so as to have any damage such as breaking and chipping even though a physical shock is given onto the tuning-fork type piezo-oscillator 36. Moreover, even in case of any tuning-fork type piezo-oscillator pieces that are downsized and thinned, there exists no chance of damage caused by collision. Eventually it becomes possible to provide the tuning-fork type piezo-oscillator piece 10 with high reliability, which is free from any change of the frequency performance and so on due to such a physical shock.

Furthermore, the shock-absorbing part 22 is provided with the function to lessen the physical shock, i.e., oscillation. Therefore, leakage of oscillation transmitted due to bending oscillation of the tuning-fork type piezo-oscillator piece 10 can be reduced. As a result, the tuning-fork type piezo-oscillator 36 can decrease its crystal impedance value and can have an excellent oscillation performance.

Since there is an enough clearance between the oscillating arms 14 and the long side part 20 so that the oscillating arms 14 do not collide with the long side part 20 even though a physical shock is given onto the tuning-fork type piezo-oscillator piece 10 to oscillate the oscillating arms 14 side to side laterally, any damage such as breaking and chipping is not caused by collision between the oscillating arms 14 and the long side part 20.

Then, it becomes possible to make a tuning-fork type piezo-oscillating device and/or a real-time clock by using the tuning-fork type piezo-oscillator piece 10 described above.

In the structure of this embodiment, the long side part 20 is equipped with the mounting part 26. However, it is also possible to provide one of the long side part 20 (the long side part 20 includes a plurality of long side parts) with a mounting part, and provide the other of the long side part 20 with two mounting parts in the structure. Still further, it is also possible to provide each of the long side part 20 with two or more mounting parts so that there exist four or more mounting parts in total in the structure. Having such a structure as described above makes it possible to implement mounting in parallel with the bottom surface of the package base 24 for sure.

Figure 2A:
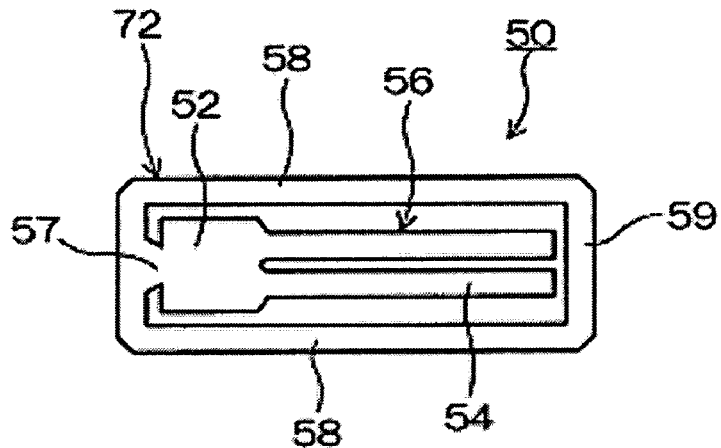
FIGS. 2A–2C are drawings for explaining a tuning-fork type piezo-oscillator piece and a tuning-fork type piezo-oscillator relating to a second exemplary embodiment.
Figure 2B:
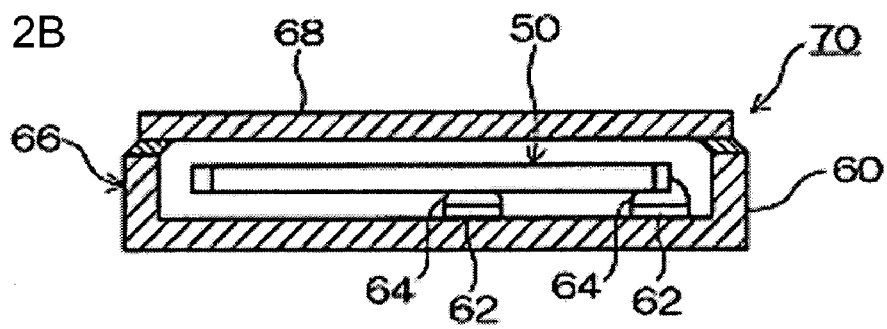
Figure 2C:
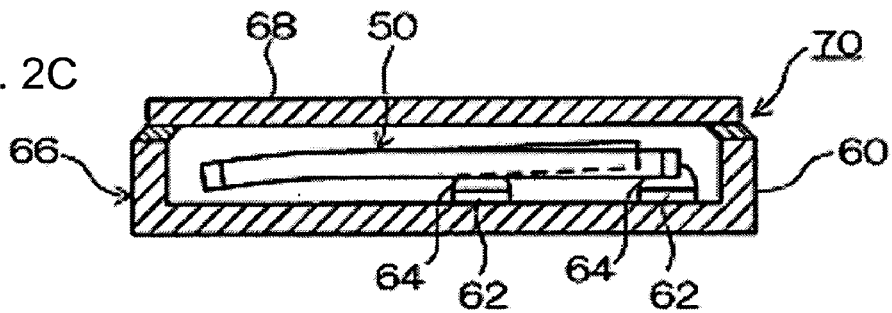

A second exemplary embodiment is described next. FIG. 2A is a top view drawing of a tuning-fork type piezo-oscillator piece, and FIG. 2B is a cross section drawing of a tuning-fork type piezo-oscillator. Meanwhile, FIG. 2C explains how the tuning-fork type piezo-oscillator piece lessens a physical shock given onto the tuning-fork type piezo-oscillator. A tuning-fork type piezo-oscillator piece 50 has a tuning-fork type piezo-oscillator piece main body 56, in which a plurality of oscillating arms 54 are elongated from an end of a base part 52. Connected to the tuning-fork type piezo-oscillator piece main body 56 is a shock-absorbing part 72 that can include a short side part 57, which is placed along the direction perpendicular to the longitudinal direction of the tuning-fork type piezo-oscillator piece main body 56, and a long side part 58, which starts from both the ends of the short side part 57 and is formed along the longitudinal direction of the tuning-fork type piezo-oscillator piece main body 56. Then, a supporting part 59 placed along the direction perpendicular to the longitudinal direction of the tuning-fork type piezo-oscillator piece main body 56 is connected to the long side part 58 on the tip side of the plurality of oscillating arms 54. Eventually in the structure, the tuning-fork type piezo-oscillator piece main body 56 is surrounded by the supporting part 59 and the shock-absorbing part 72.

The long side part 58 has a mounting part, whose bottom surface is equipped with a connecting electrode (not illustrated in the drawing) to be used when the tuning-fork type piezo-oscillator piece 50 is mounted onto a package base 60. The mounting part equipped with a connecting electrode is located to be closer to the oscillating arms 54 (closer to the tip side of the oscillating arms 54) than a center position of gravity of the tuning-fork type piezo-oscillator piece 50 in its longitudinal direction. Then, the connecting electrode is electrically continuous with an exciting electrode (not illustrated in the drawing) formed on the tuning-fork type piezo-oscillator piece main body 56 by a leading electrode (not illustrated in the drawing) formed at the shock-absorbing part 72. In addition, the supporting part 59 works as a mounting part, with which the tuning-fork type piezo-oscillator piece 50 is mounted onto the package base 60. Such a mounting part may be placed redundantly in the long side part 58, which is located to be closer to the tip side of the oscillating arms 54 than the connecting electrode.

A clearance between the oscillating arms 54 and the long side part 58 is formed to be wider than the amplitude, with which the oscillating arms 54 oscillate side to side laterally, when a physical shock is given onto the tuning-fork type piezo-oscillator piece 50. The shock-absorbing part 72 has its thickness and width so adjusted as to be provided with a function to lessen a physical shock when the physical shock is given onto the tuning-fork type piezo-oscillator piece 50.

In the case of the tuning-fork type piezo-oscillator piece 50 having the structure described above, the connecting electrode placed at the long side part 58 and a package side mounting electrode 62 formed on the package base 60 are fixedly connected each other with an adhesive material 64. Furthermore, a bottom surface of the supporting part 59 is fixedly connected to the package base 60 by means of the adhesive material 64. When the supporting part 59 gets connected to the package base 60, two positions at both the ends of the bottom surface of the supporting part 59 may be supplied with the adhesive material 64 and be connected. It is also possible to apply the adhesive material 64 only to a position in the entire bottom surface of the supporting part 59 and connect the supporting part.

The adhesive material 64 connecting the connecting electrode and the package side mounting electrode 62 can include a conductive adhesive material, a conductive sheet, a conductive film, a gold bump or a gold-tin brazing material and so on. Especially when a silicone-base conductive adhesive material is used, the heat resisting performance is improved and generating gas from the conductive adhesive material is controlled. Meanwhile, using a gold bump results in no gas generated, and therefore it is a suitable method for sealing a package 66 in vacuum condition. In case an electrical conductivity is not obtained as required, a bonding wire may be used to have a sufficient electrical conductivity. The adhesive materials described above can also be used for the adhesive material 64 connecting the supporting part 59 and the package base 60, and even an adhesive materials with no electrical conductivity can be used for the above purpose. Then, a lid 68 is connected onto the upper end surface of the package base 60 by using a low-melting glass or by seam welding to construct a tuning-fork type piezo-oscillator 70.

Next, an action of the tuning-fork type piezo-oscillator piece 50 under a condition where a physical shock caused by dropping and so on is given onto the tuning-fork type piezo-oscillator 70. When being given onto the tuning-fork type piezo-oscillator 70, such a physical shock is transmitted to the tuning-fork type piezo-oscillator piece 50. Subsequently, the shock-absorbing part 72 vertically oscillates, while bending itself by having the vibration center at the connecting electrode positions; because the shock-absorbing part 72 is provided with the function to lessen the physical shock. The oscillating motion lessens the physical shock to be transmitted to the tuning-fork type piezo-oscillator piece 50. Thus, the tuning-fork type piezo-oscillator piece 50 has the tips of the oscillating arms 54 just move slightly in the vertical direction so that there is no chance for the tuning-fork type piezo-oscillator piece main body 56 to collide with the package 66 (Refer to FIG. 2(c)). Also, there is no chance for the oscillating arms 54 and the long side part 58 to collide with each other.

In the structure described above; the shock-absorbing part 72 of the tuning-fork type piezo-oscillator piece 50 is provided with the function to lessen the physical shock so that; even though a physical shock is given onto the tuning-fork type piezo-oscillator 70, the shock-absorbing part 72 lessens the physical shock and the tuning-fork type piezo-oscillator piece main body 56 does not get shaken violently. Consequently, there is no chance for the tuning-fork type piezo-oscillator piece 50 to collide with the package 66 so as to have any damage such as breaking and chipping. Furthermore, the tuning-fork type piezo-oscillator piece is provided with the function to lessen the physical shock so that, even though the tuning-fork type piezo-oscillator piece is downsized and thinned, there exists no chance of damage. Eventually it becomes possible to provide the tuning-fork type piezo-oscillator piece 50 with high reliability, which is free from any change of the frequency performance and so on due to such a physical shock.

Furthermore, the shock-absorbing part 72 is able to reduce leakage of oscillation transmitted due to bending oscillation of the tuning-fork type piezo-oscillator piece 50.

As a result, the tuning-fork type piezo-oscillator 70 can decrease its crystal impedance value and can have an excellent oscillation performance.

Since there is an enough clearance between the oscillating arms 54 and the long side part 58 so that the oscillating arms 54 do not collide with the long side part 58 even though a physical shock is given onto the tuning-fork type piezo-oscillator piece 50 to oscillate the oscillating arms 54 side to side laterally, any damage such as breaking and chipping is not caused by collision between the oscillating arms 54 and the long side part 58.

Furthermore, if the mounting part formed in the long side part 58 is located to be closer to the oscillating arms 54 than the center position of gravity of the tuning-fork type piezo-oscillator piece 50 in its longitudinal direction, displacement is caused initiatively on the side of the base part 52. Under such an arrangement, displacement of the tuning-fork type piezo-oscillator piece 50 itself is controlled when a physical shock is given, so that there is no chance for the tuning-fork type piezo-oscillator piece 50 to collide with the package and cause breaking and chipping.

Still further, in the tuning-fork type piezo-oscillator piece 50 relating to the second exemplary embodiment, a frame part is formed to surround the tuning-fork type piezo-oscillator piece 50. Therefore, being compared with any tuning-fork type piezo-oscillator piece having no such a frame part, the tuning-fork type piezo-oscillator piece relating to the second exemplary embodiment can improve its physical strength.

Then, it becomes possible to make a tuning-fork type piezo-oscillating device and/or a real-time clock by using the tuning-fork type piezo-oscillator piece 50 described above.

Figure 6A:
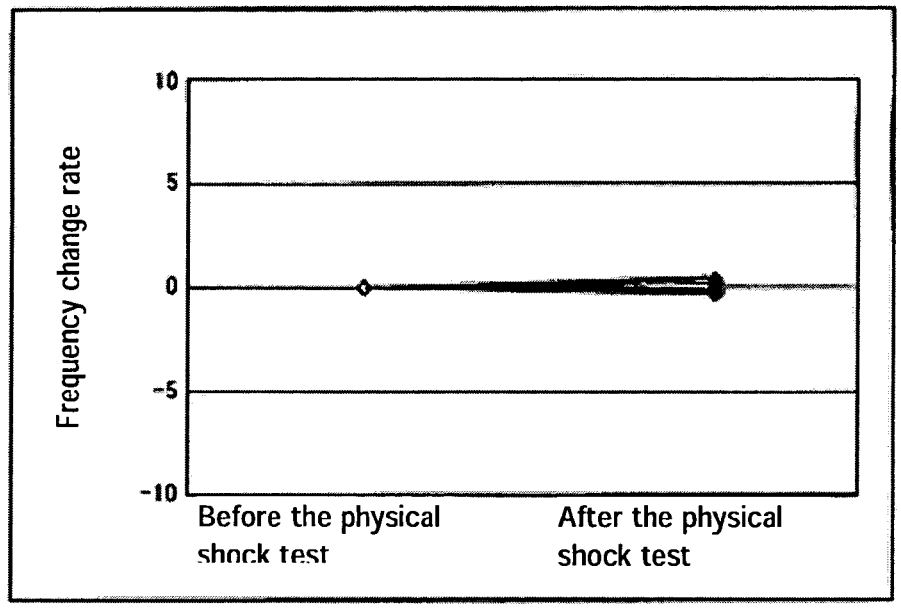
FIGS. 6A–6B show graphs indicating test results of a physical shock test.
Figure 6B:
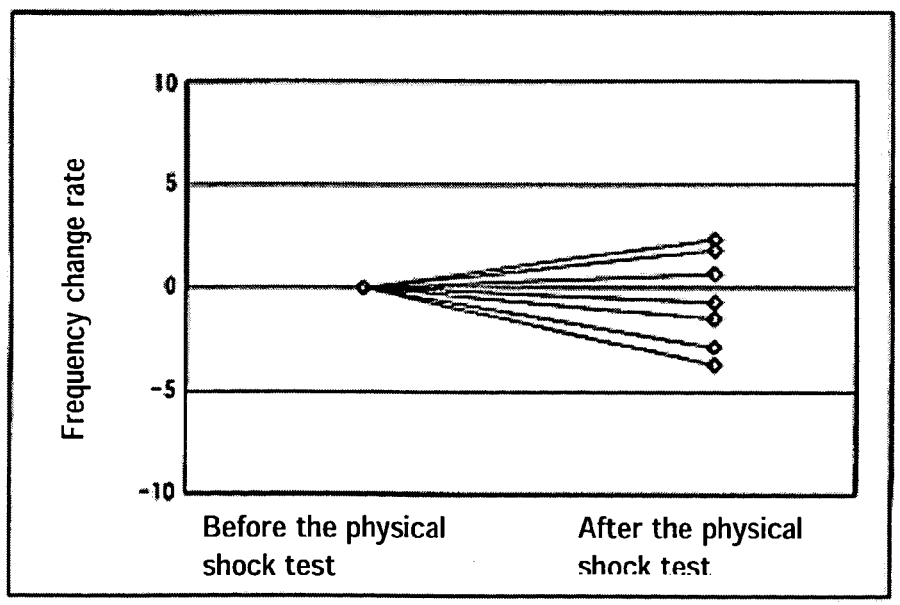

A physical shock test for the tuning-fork type piezo-oscillator 70 is described below. In the physical shock test, the tuning-fork type piezo-oscillator 70 described above and a related type of tuning-fork type piezo-oscillator without the shock-absorbing part 72 are used. In the physical shock test, each tuning-fork type piezo-oscillator is placed into a jig and it gets dropped 10 times from a height of 150 cm in each of the directions of the length, width and height of the tuning-fork type piezo-oscillator. FIG. 6 shows the test results. By referring to the original oscillation frequency that each objective tuning-fork type piezo-oscillator had before the physical shock test, the graphs show how much the oscillation frequency has changed in frequency change rate after the physical shock test. FIG. 6A shows the test results on the tuning-fork type piezo-oscillator 70 described above, while FIG. 6B shows the physical shock test results on the conventional type of tuning-fork type piezo-oscillator. In the case of the tuning-fork type piezo-oscillator 70 described above, it is understood according to FIG. 6A that there is almost no change in the oscillation frequency even after the physical shock test. Then, the deviation on the oscillation frequency values after the physical shock test is calculated to give σ=0.221.

Meanwhile, in the case of the related type of tuning-fork type piezo-oscillator, it is understood according to FIG. 6B that there is a great change in the oscillation frequency after the physical shock test. Then, the deviation on the oscillation frequency values after the physical shock test is calculated to give σ=2.061. According to the test results, it can be said that the tuning-fork type piezo-oscillator 70 described above has had almost no change in the oscillation frequency because the shock-absorbing part 72 of the tuning-fork type piezo-oscillator piece 50 lessened the physical impact. On the other hand, it can be said that the conventional type of tuning-fork type piezo-oscillator had no shock-absorbing part so that the base part and the oscillating arms were exposed to the physical shock and there arose a great change in the oscillation frequency.

Figure 7A:
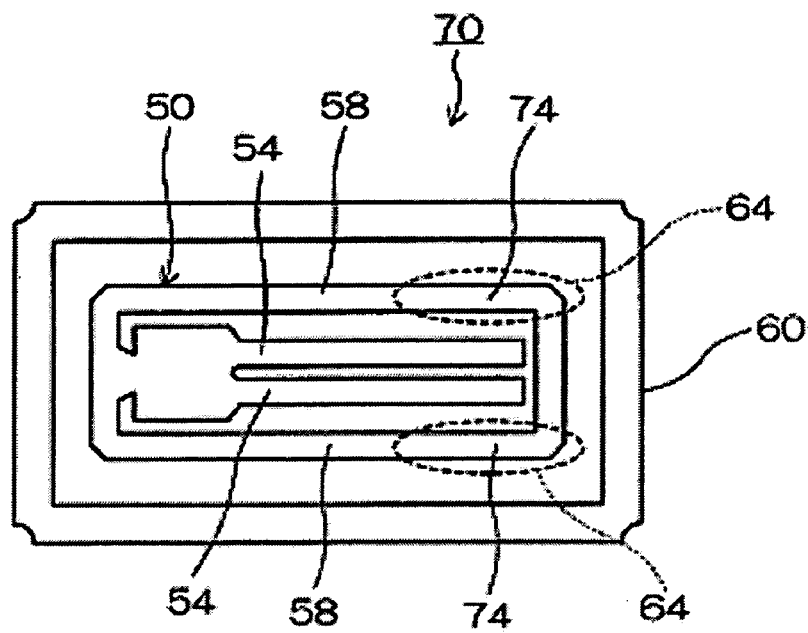
FIGS. 7A–7B are drawings for explaining a modified example of the tuning-fork type piezo-oscillator relating to the second exemplary embodiment.
Figure 7B:
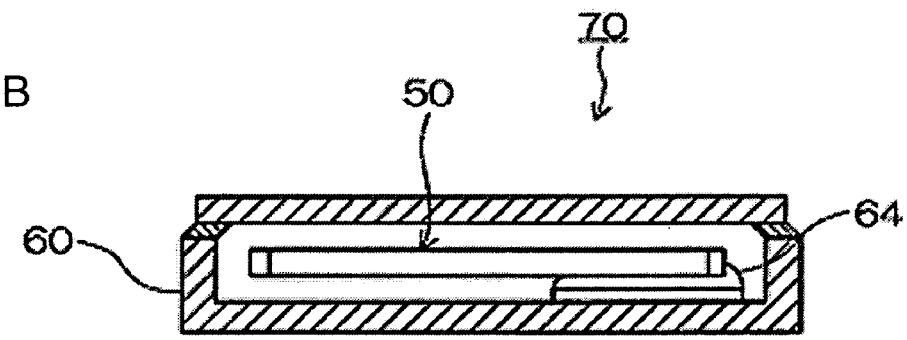

The tuning-fork type piezo-oscillator 70 relating to the second embodiment has a structure in which mounting onto the package base 60 is implemented by the mounting part to mechanically and electrically connect the tuning-fork type piezo-oscillator piece 50 and the package side mounting electrode 62, and by the supporting part 59 to mechanically connect the tuning-fork type piezo-oscillator piece 50 and the package base 60. However, the tuning-fork type piezo-oscillator piece 50 may be mounted onto the package base 60 even by using only the mounting part. FIG. 7 shows drawings of a modified example of the tuning-fork type piezo-oscillator relating to the second embodiment. FIG. 7A is a top view of the tuning-fork type piezo-oscillator, while FIG. 7B is a cross section drawing of the tuning-fork type piezo-oscillator. Incidentally, the lid is omitted in FIG. 7A. In the long side part 58, a mounting part 74 is placed at a position to be closer to the tip side of the oscillating arms 54 than the center position of gravity of the tuning-fork type piezo-oscillator piece 50. The mounting part 74 is formed to have a long shape along the long side part 58 so that connecting onto the package base 60 is done with a linear area. Namely, the adhesive material 64 is placed into each of the areas encircled with dotted line shown in FIG. 7A, and then the tuning-fork type piezo-oscillator piece 50 is mounted onto the package base 60 by using the areas. According to this arrangement, supporting the tuning-fork type piezo-oscillator piece 50 even with two positions makes it possible to mount the tuning-fork type piezo-oscillator piece 50 in parallel with the bottom surface of the package base 60. Consequently, even though a physical shock is given onto the tuning-fork type piezo-oscillator 70, the tuning-fork type piezo-oscillator piece 50 does not happen to collide with the package base 60.

Figure 3A:
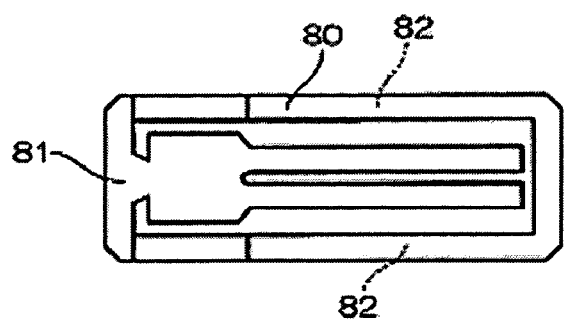
Figure 3C:
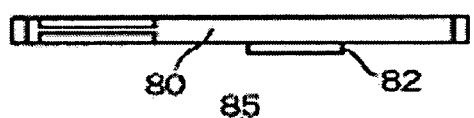
Figure 3D:
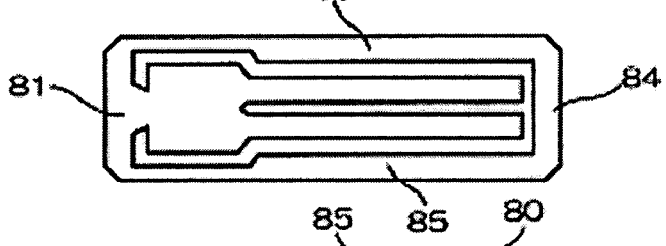
Figure 3E:
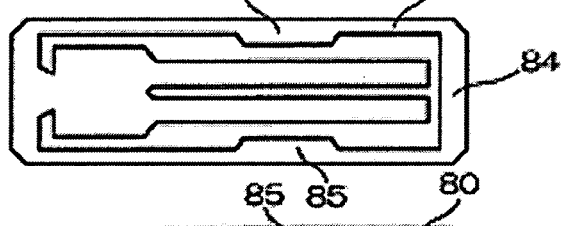
Figure 3F:

Modified examples of the tuning-fork type piezo-oscillator piece relating to the second embodiment are indicated next. FIG. 3 shows drawings of the modified examples of the tuning-fork type piezo-oscillator piece. FIG. 3A and FIG. 3B are drawings for explaining a first modified example, namely, FIG. 3A and FIG. 3B are a top view drawing and a cross section drawing, respectively. The tuning-fork type piezo-oscillator piece of the first modified example apparently has the same outward form as the tuning-fork type piezo-oscillator piece 50 relating to the second embodiment, but the area between a connecting electrode 82 (a mounting part 85) of a long side part 80 and a short side part 81 is formed to be thinner. Manufacturing the long side part 80 may be done by applying a half-etching method and so on. FIG. 3C is a drawing for explaining a second modified example. In the second modified example, the area between the mounting part 85 formed in the long side part 80 and the short side part 81 is formed to be narrower, while the area between the mounting part 85 and a supporting part 84 in the long side part 80 is formed to be wider toward the inside part of the frame. FIG. 3D is a drawing for explaining a third modified example. In the third modified example, the long side part 80 is formed to be narrower but only the mounting part 85, in which the connecting electrode is placed, is formed to be wider. FIG. 3E is a drawing for explaining a fourth modified example. In the fourth modified example, the area between the mounting part 85 formed in the long side part 80 and the short side part 81 is formed to be narrower, while the area between the mounting part 85 and the supporting part 84 is formed to be wider toward the outside part of the frame. FIG. 3F is a drawing for explaining a fifth modified example. In the fifth modified example, the area between the mounting part 85 formed in the long side part 80 and the short side part 81 is formed to be narrower, while the area between the mounting part 85 and the supporting part 84 is formed to be wider toward both the outside and inside parts of the frame.

Figure 3G:
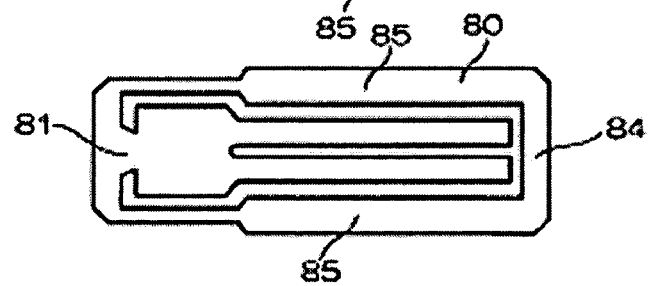
Figure 4A:
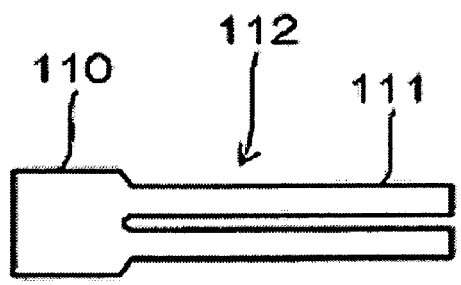
FIGS. 4A–4B are drawings for explaining a tuning-fork type piezo-oscillator piece, equipped with a base part and oscillating arms, relating to a related art.
Figure 4B:
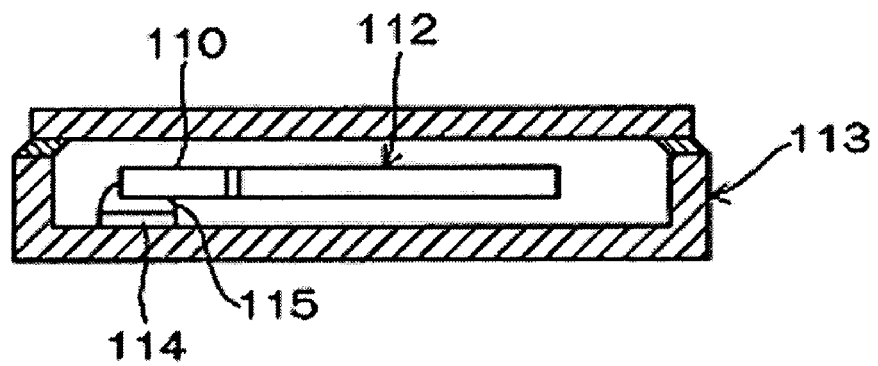
Figure 5A:
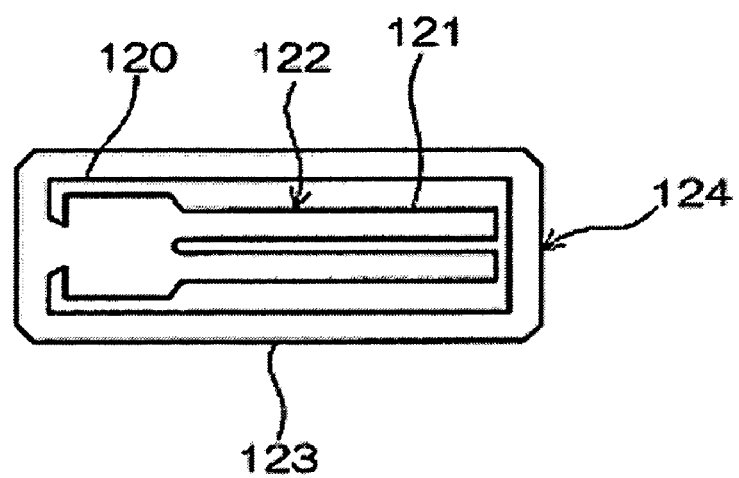
FIGS. 5A–5B are drawings for explaining a tuning-fork type piezo-oscillator piece, equipped with a base part, oscillating arms, and a supporting part, relating to a related art.
Figure 5B:
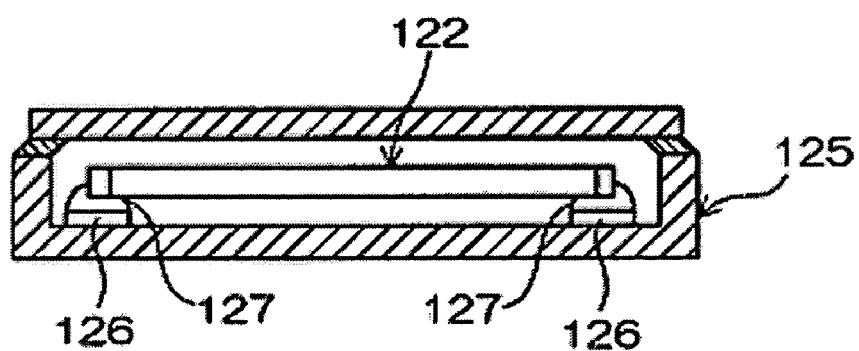

FIG. 3G is a drawing for explaining a sixth modified example. In the sixth modified example, the long side part 80 is formed to be narrower; while the mounting part 85, in which the connecting electrode is placed, is formed to be wider toward the inside part of the frame, and the area starting from a point neighboring to the connecting part between the base part and the oscillating arms up to the supporting part 84 is formed to be wider toward the outside part of the frame. In the first to sixth modified examples, the mounting part 85 is located to be closer to the tip side of the oscillating arms than the center of gravity of the tuning-fork type piezo-oscillator piece. Then, the mounting part 85 is formed to be longer than where the adhesive material is placed, i.e., the connecting electrode. Therefore, once the shock-absorbing part gets oscillated by a physical shock, the stress caused by the oscillation is concentrated on the edge position of the adhesive material part in the long side part 80. However, the position, where the stress is given, in the long side part 80 is formed to be so thick in its width that the long side part 80 does not get broken. These first to sixth modified examples can bring about the same action and effects as the tuning-fork type piezo-oscillator piece 50 relating to the second exemplary embodiment does.

Figure 8A:
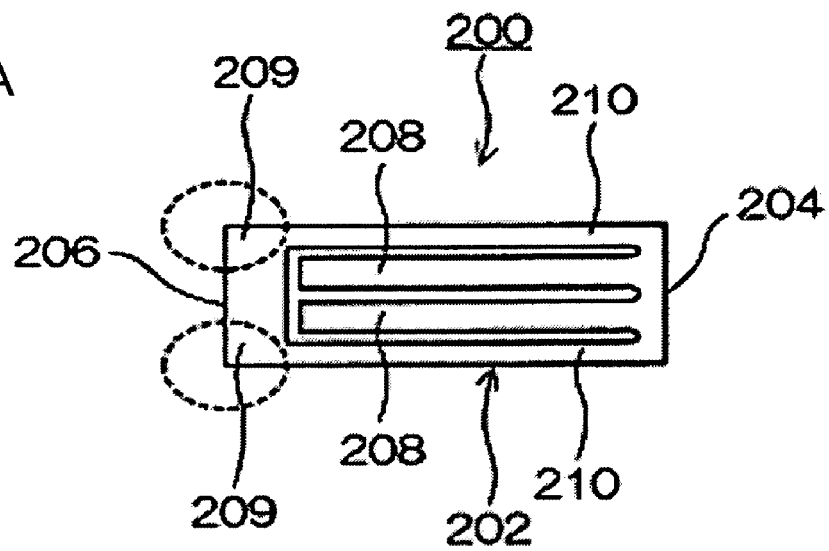
FIGS. 8A–8B are drawings for explaining a tuning-fork type piezo-oscillator piece relating to a third exemplary embodiment.
Figure 8B:
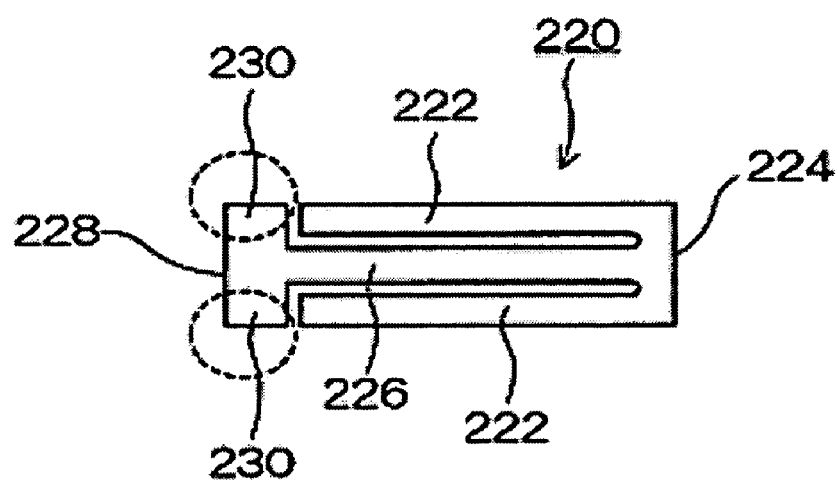

Next, a third exemplary embodiment is described. FIG. 8 shows drawings for explaining tuning-fork type piezo-oscillator pieces relating to the third embodiment. The tuning-fork type piezo-oscillator pieces relating to the third exemplary embodiment have a form of tuning-fork type piezo-oscillator piece without any base part. FIG. 8A is a top view drawing of a tuning-fork type piezo-oscillator piece equipped with a frame part, and FIG. 8B is a top view drawing of a tuning-fork type piezo-oscillator piece equipped with no frame part. A tuning-fork type piezo-oscillator piece 200 shown in FIG. 8A has a rectangular frame part 202; in which a plurality of oscillating arms 208 are placed at the inner side of one short side part 204 of the frame part 202, being elongated toward the other short side part 206 to form the structure. The other short side part 206 is formed to be wide enough, and at the bottom surface there, a mounting part 209 is formed for mounting the tuning-fork type piezo-oscillator piece 200 onto a package base (not illustrated in the drawing). Meanwhile, a long side part 210 of the frame part 202 works as a shock-absorbing part, and the thickness and width of the long side part 210 are adjusted according to the size and the center position of gravity of the oscillating arms and so on, in order to have a function to lessen a physical shock (as a shock-absorbing part) when the physical shock is given onto the tuning-fork type piezo-oscillator piece 200. Also, the shock-absorbing function may be provided only to a part of the long side part. For such an arrangement, the length, width and thickness for the shock-absorbing function are adjusted. Furthermore, the long side part 210 may be shaped into any of the forms of the long side part 80 described in regard to the modified examples relating to the second embodiment.

For the oscillating arms 208 of the tuning-fork type piezo-oscillator piece 200, an exciting electrode (not illustrated in the drawing) is formed; meanwhile, at the mounting part 209, a connecting electrode (not illustrated in the drawing) to be connected to a package side mounting electrode (not illustrated in the drawing) placed on the package base is formed. Then, the exciting electrode and the mounting electrodes are connected by a leading electrode (not illustrated in the drawing) formed at the long side part 210. In each of the areas encircled with dotted line shown in FIG. 8A, an adhesive material is placed. Then, while the connecting electrodes and the mounting electrodes are made continuous with each other, the tuning-fork type piezo-oscillator piece 200 is mounted onto the package base. For the above adhesive material, the adhesive material 30 described in regard to the first embodiment can be used. In the manner described above, the tuning-fork type piezo-oscillator is constructed.

A tuning-fork type piezo-oscillator piece 220, shown in FIG. 8B, is equipped with two oscillating arms 222 that are placed to be parallel, and each of the oscillating arms 222 has its one end connected to a short side part 224. In the space between the oscillating arms 222, a long side part 226 is placed along the oscillating arms 222. The tip of the long side part 226 is elongated in the direction, perpendicular to the direction along which the oscillating arms 222 lie, to form a short side part 228. Making use of the long side part 226 and the short side part 228, a foot part is formed to have a T-letter shape. The bottom surface of the short side part 228 becomes a mounting part 230. Meanwhile, the long side part 226 works as a shock-absorbing part, and its thickness and width are adjusted according to the size and the center position of gravity of the oscillating arms 222. With regard to the long side part 226, its thickness and width may be designed by taking into account the size and the center position of gravity of the oscillating arms 222, so as to protect the oscillating arms 222 from any torsion when a physical shock is given.

For the oscillating arms 222 of the tuning-fork type piezo-oscillator piece 220, an exciting electrode (not illustrated in the drawing) is formed; meanwhile, at the mounting part 230, a connecting electrode (not illustrated in the drawing) to be connected to a package side mounting electrode (not illustrated in the drawing) placed on the package base (not illustrated in the drawing) is formed. Then, the exciting electrode and the mounting electrodes are connected by a leading electrode (not illustrated in the drawing) formed at the long side part 226. In each of the areas encircled with dotted line shown in FIG. 8B, an adhesive material is placed. Then, while the connecting electrodes and the mounting electrodes are made continuous with each other, the tuning-fork type piezo-oscillator piece 220 is mounted onto the package base. For the above adhesive material, the adhesive material 30 described in regard to the first embodiment can be used. In the manner described above, the tuning-fork type piezo-oscillator is constructed.

If any physical shock due to dropping and so on is given onto a tuning-fork type piezo-oscillator equipped with either of the tuning-fork type piezo-oscillator pieces 200 and 220 shown in FIG. 8A and FIG. 8B, respectively, the physical shock is transmitted from the package base to the tuning-fork type piezo-oscillator piece 200 or 220 through the mounting part 209 or 230. However, the physical shock is lessen by the long side part 210 or the long side part 226 whose thickness and width are adjusted accordingly, so that the objective oscillating arms 208 or 222 do not get shaken violently. Consequently, the tuning-fork type piezo-oscillator pieces 200 and 220 are able to lessen such a physical shock, and therefore, the oscillating arms 208 and 222 do not have any damage such as breaking or chipping. A clearance between the oscillating arms 208 or 222 and the corresponding long side part 210 or 226 is wider than the amplitude, with which the oscillating arms 208 or 222 oscillate when a physical shock is given to the corresponding tuning-fork type piezo-oscillator piece 200 or 220; there is no chance for the oscillating arms 208 and 222 to collide with the corresponding long side part 210 or 226 so as to have any damage such as breaking or chipping. Furthermore, since the tuning-fork type piezo-oscillator pieces 200 and 220 do not have any base part, they can be downsized.

Still further, since the long side part 210 or 226 is placed between the corresponding oscillating arms 208 or 222 and the corresponding mounting part 209 or 230, any oscillation leaked from the corresponding oscillating arms 208 or 222 can be lessened at the long side part 210 or 226. Therefore, a tuning-fork type piezo-oscillator provided with an excellent oscillation performance can be obtained.

Then, a tuning-fork type piezo-oscillating device can be materialized by mounting a circuit for oscillating the corresponding tuning-fork type piezo-oscillator piece 200 or 220 onto the tuning-fork type piezo-oscillator described above.

Next, a fourth exemplary embodiment is described. FIG. 9 shows drawings for explaining some tuning-fork type piezo-oscillator pieces and a tuning-fork type piezo-oscillator relating to the fourth embodiment. A tuning-fork type piezo-oscillator piece 240 relating to the fourth embodiment has a tuning-fork type piezo-oscillator piece main body 246, which is composed of a base part 242 and a plurality of oscillating arms 244 elongated from one end of the base part 242, and a rectangular frame part 248 is placed in the structure so as to surround the tuning-fork type piezo-oscillator piece main body 246. To the other end of the base part 242, one short side part 250 of the frame part 248 is connected. Placed in a long side part 252 of the frame part 248 are a shock-absorbing part 254 as well as a mounting part 256 that is located to be closer to the tip side the oscillating arms 244 than the center position of gravity of the tuning-fork type piezo-oscillator piece 240.

Figure 9A:
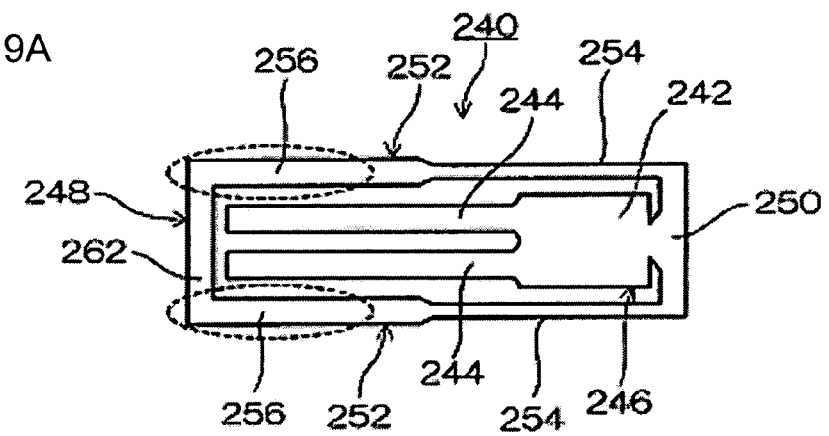
FIGS. 9A–9D are drawings for explaining a tuning-fork type piezo-oscillator piece and a tuning-fork type piezo-oscillator relating to a fourth exemplary embodiment.
Figure 9B:
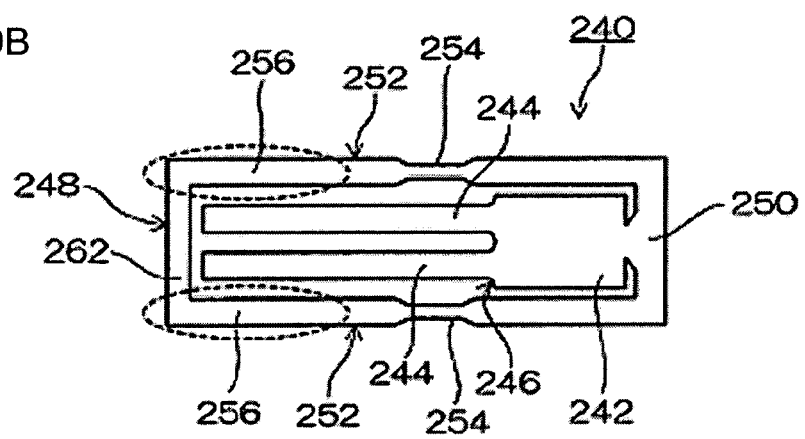

The shock-absorbing part 254 is formed in a span, existing between the mounting part 256 and one short side part 250. As shown in FIG. 9A, the shock-absorbing part is materialized by forming it to be narrow and thin. The shock-absorbing part 254 may also be materialized, as FIG. 9B shows, by forming just a part of the long side part 252, i.e., a part of the span existing between the mounting part 256 and one short side part 250 in the long side part 252, to be narrow and thin. The part formed to be narrow and thin, i.e., the narrowed part in other words, should be located around the middle part of the span between the mounting part 256 and one short side part 250. Such a narrowed part may be placed redundantly in the long side part 252. The width, thickness, and length of the part formed to be narrow and thin are designed according to the size and the center position of gravity of the tuning-fork type piezo-oscillator piece 240 and so on.

Figure 9C:
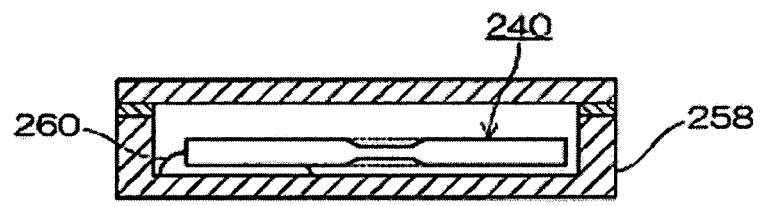

A connecting electrode (not illustrated in the drawing) is placed at a bottom surface of the mounting part 256, and the connecting electrode may be formed in a dotted layout, or even in a linear layout as well along the long side part 252. When the tuning-fork type piezo-oscillator piece 240 shown in FIG. 9A or FIG. 9B is mounted onto a package base 258, the mounting part 256 and the package base 258 are connected via an adhesive material 260. As adhesive material 260, the adhesive material 30 described in regard to the first embodiment can be used. FIG. 9C is a cross section drawing of a tuning-fork type piezo-oscillator. Incidentally, FIG. 9C shows the materialization in which the tuning-fork type piezo-oscillator piece 240 shown in FIG. 9B is mounted onto the package. The adhesive material 260 is placed to be closer to the tip side of the oscillating arms 244 than the connection point of the mounting part 256 and the part formed to be narrow and thin. That is to say, the tuning-fork type piezo-oscillator piece 240 and the package base 258 are connected at a position, which is away from the connection point.

Incidentally; if an edge part of the adhesive material 260 is positioned at a bottom surface of the connection point, stress due to oscillation is concentrated on the connection point when a physical shock is given onto the tuning-fork type piezo-oscillator piece 240 to oscillate the shock-absorbing part 254. Since the part formed to be narrow and thin in the long side part 252 is poor in its strength, the stress breaks the connection point. However, in this exemplary embodiment, the mounting part 256 is positioned over the edge part of the adhesive material 260; and therefore, the connection point does not get broken even though the stress due to oscillation of the shock-absorbing part 254 is concentrated. Since the tuning-fork type piezo-oscillator piece 240 is connected onto the package base 258 by linear-formed connection at each mounting part 256, the tuning-fork type piezo-oscillator piece 240 can be mounted in parallel with the bottom surface of the package base 258.

In case the connecting electrode is formed in a dotted layout, a bottom surface of a short side part 262 positioned on the tip side of the oscillating arms 244 should be used as a supporting part. Thus the tuning-fork type piezo-oscillator piece 240 is connected onto the package base 258 by connection at each mounting part 256 and a supporting part, so that the tuning-fork type piezo-oscillator piece 240 can be mounted in parallel with the bottom surface of the package base 258.

Figure 9D:
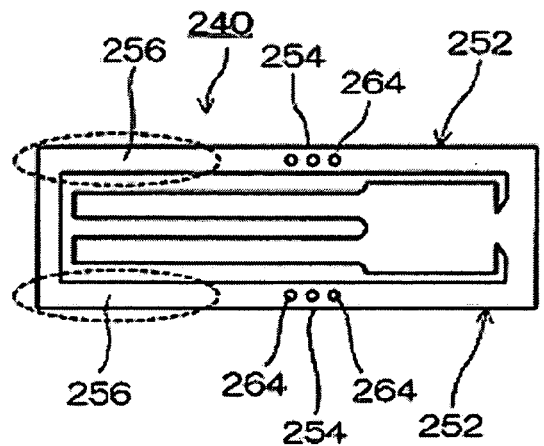

Also, the shock-absorbing part 254 may be formed by making a hole part 264 in the long side part 252, as FIG. 9D shows. According to the design of the shock-absorbing part 254, any hole shape may be applied in the hole part 264 such as circular, oval, rectangular, triangular, and so on. In addition, the size and layout pitch in the hole part 264 may also be designed according to the design of the shock-absorbing part 254, as required. The hole part should be formed at the same time when the tuning-fork type piezo-oscillator piece 240 is formed by etching. Still further, a concave part may be used instead of the hole part 264. The concave part should be formed at the same time when a groove is formed in the oscillating arms 244. Then, the depth of the concave part can be adjusted as required by interrupting only the etching for the concave part while forming the groove by etching. The concave part may be placed on either of the upper and lower surfaces of the long side part 252, or it may be placed on both the upper and lower surfaces.

If any physical shock due to dropping and so on is given onto a tuning-fork type piezo-oscillator equipped with the tuning-fork type piezo-oscillator piece 240 described above, the physical shock is transmitted from the package to the tuning-fork type piezo-oscillator piece 240 through the mounting part 256. However, the physical shock is lessen by oscillation of the long side part 252 so that the tuning-fork type piezo-oscillator piece main body 246 does not get shaken violently. Consequently, the tuning-fork type piezo-oscillator piece 240 is able to lessen such a physical shock, and therefore, the oscillating arms 244 do not have any damage such as breaking or chipping. A clearance between the oscillating arms 244 and the long side part 252 is wider than the amplitude, with which the oscillating arms 244 oscillate when a physical shock is given to the tuning-fork type piezo-oscillator piece 240; there is no chance for the oscillating arms 244 to collide with the long side part 252 so as to have any damage such as breaking or chipping.

Still further, since the long side part 252 is placed between the oscillating arms 244 and the mounting part 256, any oscillation leaked from the oscillating arms 244 can be lessened at the long side part 252. Therefore, a tuning-fork type piezo-oscillator provided with an excellent oscillation performance can be obtained.

Then, a tuning-fork type piezo-oscillating device can be materialized by mounting a circuit for oscillating the tuning-fork type piezo-oscillator piece 240 onto the tuning-fork type piezo-oscillator described above.

The groove mentioned above is explained next. Since the groove is placed on the oscillating arms, it is possible for any tuning-fork type piezo-oscillator piece to have the groove on its oscillating arms regardless of the shape of the tuning-fork type piezo-oscillator piece. Therefore, the groove can be formed on any of the tuning-fork type piezo-oscillator pieces relating to the first to fourth embodiments.

Figure 10A:
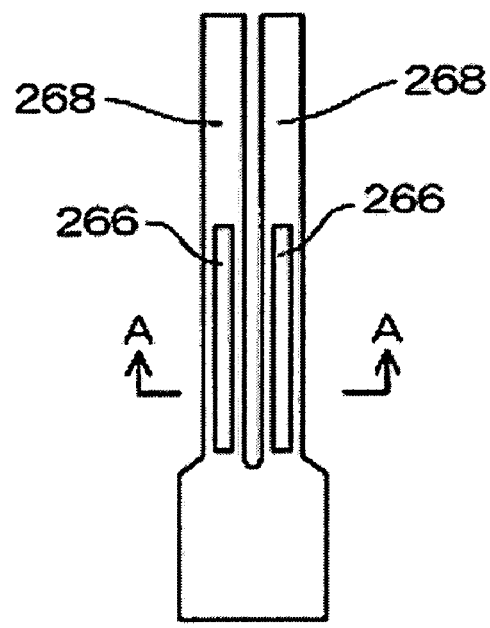
FIGS. 10A–10B are drawings for explaining a groove to be placed on oscillating arms.
Figure 10B:
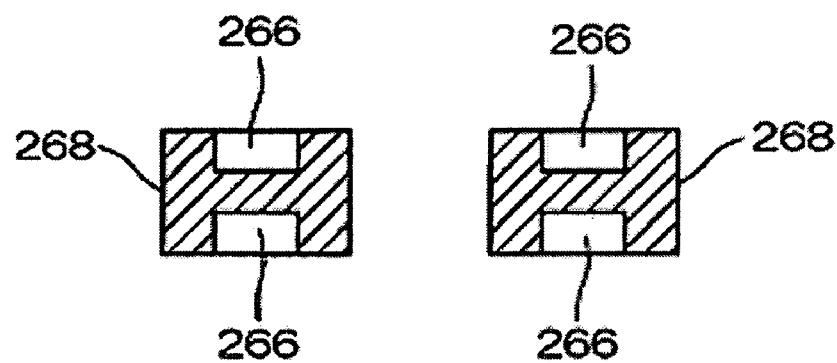

FIG. 10 shows drawings for explaining the groove placed on the oscillating arms. FIG. 10A is a top view drawing of a tuning-fork type piezo-oscillator piece main body, while FIG. 10B is a drawing to show a cross section at the position A—A line. Incidentally, an exciting electrode and so on are omitted in the illustrations of FIG. 10. A groove 266 is formed on each of the upper and lower surfaces of the oscillating arms 268, along a longitudinal direction of the oscillating arms 268. As a result, the oscillating arms 268 are H-shaped in section. If the oscillating arms 268 are equipped with the groove 266, the electric field efficiency of the oscillating arms 268 by the voltage imposed onto the exciting electrode is so improved that the oscillation loss of bending oscillation becomes low and the crystal impedance can get decreased to be low even though the oscillating arms 268 are downsized to be short or thin.

Figure 11:
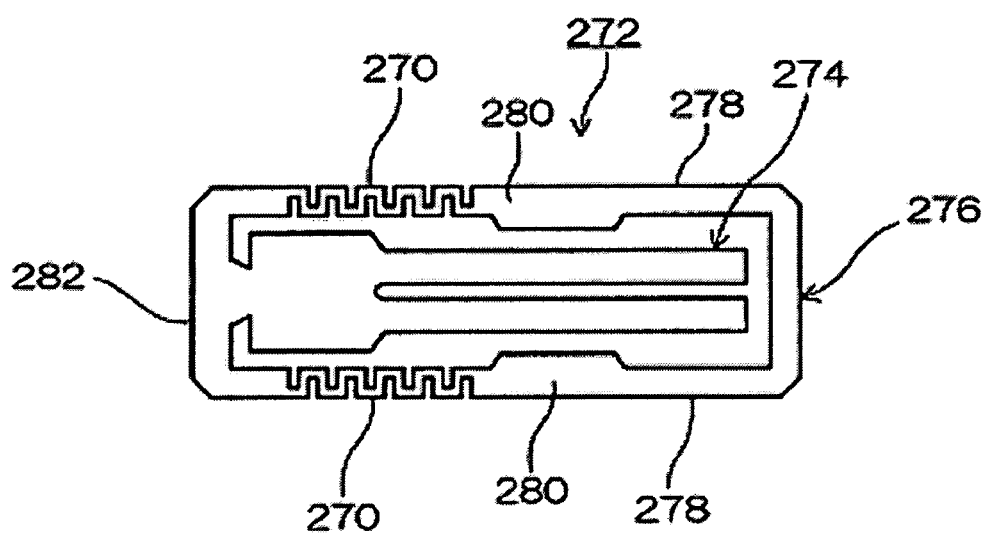
FIG. 11 is a drawing for explaining a shock-absorbing part.

In the first to fourth exemplary embodiments, each corresponding shock-absorbing part is explained. Instead of applying such a shock-absorbing part, it is also possible to use a shock-absorbing part having a form described next. FIG. 11 shows a drawing for explaining a shock-absorbing part. As an example of a tuning-fork type piezo-oscillator piece in which a shock-absorbing part 270 is applied, an arrangement using a tuning-fork type piezo-oscillator piece 272 having a tuning-fork type piezo-oscillator piece main body 274, and a rectangular frame part 276 surrounding the tuning-fork type piezo-oscillator piece main body is explained. The shock-absorbing part 270 is placed between a mounting part 280 of a long side part 278 in the frame part 276 and a short side part 282 on a base side part. The shock-absorbing part 270 is formed along the longitudinal direction of the long side part 278 by making cuts alternately from the inner side and outer side of the long side part 278. Namely, the shock-absorbing part 270 is formed like a spring. The length of the shock-absorbing part 270, and the width and length of the cut part are appropriately designed according to the size and the center position of gravity of the tuning-fork type piezo-oscillator piece 272. Thus, the shock-absorbing part 270 should be formed at the same time when the tuning-fork type piezo-oscillator piece 272 is formed by etching.

A tuning-fork type piezo-oscillator can be constructed by mounting the tuning-fork type piezo-oscillator piece 272 onto a package (not illustrated in the drawing). If any physical shock is given onto a tuning-fork type piezo-oscillator, the physical shock is transmitted to the tuning-fork type piezo-oscillator piece 272. However, even so, the physical shock can be lessen by oscillation of the shock-absorbing part 270. Furthermore, the distance from the tuning-fork type piezo-oscillator piece main body 274 to the mounting part 280 becomes longer, so that oscillation leakage of bending oscillation can be reduced, and therefore a tuning-fork type piezo-oscillator provided with an excellent oscillation performance can be obtained.

While this invention has been described in conjunction with the specific embodiments thereof, it is evident that many alternatives, modifications, and variations will be apparent to those skilled in the art. Accordingly, preferred embodiments of the invention as set forth herein are intended to be illustrative, not limiting. There are changes that may be made without departing from the spirit and scope of the invention.

What is claimed is:

1. A tuning-fork type piezo-oscillator piece, comprising:
    a tuning-fork type piezo-oscillator piece main body having a plurality of oscillating arms;
    a short side part that extends along a direction perpendicular to a longitudinal direction of the tuning-fork type piezo-oscillator piece main body, and that is connected to the tuning-fork type piezo-oscillator piece main body; and
    a long side part that extends from the short side part and along the longitudinal direction of the tuning-fork type piezo-oscillator piece main body, and that includes a shock-absorbing part.

2. The tuning-fork type piezo-oscillator piece according to claim 1, further including:
    a mounting part that is formed at a position in the long side part which is located to be closer to a tip side of the plurality of oscillating arms than a center position of total gravity of the tuning-fork type piezo-oscillator piece main body, the short side part and the long side part.

3. The tuning-fork type piezo-oscillator piece according to claim 2,
    the long side part being elongated from the mounting part toward the tip side of the plurality of oscillating arms to be formed along a direction perpendicular to the longitudinal direction of the tuning-fork type piezo-oscillator piece main body so that a supporting part connected to the long side part is formed.

4. The tuning-fork type piezo-oscillator piece according to claim 1,
    at least one of a width and a thickness of the shock-absorbing part being formed so as to be thinner than a width and a thickness of the long side part.

5. The tuning-fork type piezo-oscillator piece according to claim 1,
    the shock-absorbing part being formed by providing the long side part with a hole part or an concave part.

6. The tuning-fork type piezo-oscillator piece according to claim 1, further including:
    a tip of the long side part that is elongated along a direction perpendicular to the longitudinal direction of the tuning-fork type piezo-oscillator piece main body to form a short side part on the tip side of the plurality of oscillating arms and to have a mounting part at a bottom surface of the short side part.

7. The tuning-fork type piezo-oscillator piece according to claim 1,
    a clearance between the plurality of oscillating arms and the long side part being wider than an amplitude with which the plurality of oscillating arms oscillate when a physical shock is given onto the tuning-fork type piezo-oscillator piece.

8. A method of mounting a tuning-fork type piezo-oscillator piece, comprising:

mounting a long side part at a position according to a center position of gravity of the tuning-fork type piezo-oscillator piece including a tuning-fork type piezo-oscillator piece main body and a shock-absorbing part that includes a short side part and a long side part.

9. The method of mounting a tuning-fork type piezo-oscillator piece according to claim 8, the long side part being further provided with mounting at at least one more location.

10. A method of mounting a tuning-fork type piezo-oscillator piece, comprising:

mounting a long side part at a position, which is located to be closer to a side of a plurality of oscillating arms than a center position of gravity of the tuning-fork type piezo-oscillator piece including a tuning-fork type piezo-oscillator piece main body that includes a base part and the plurality of oscillating arms, a shock-absorbing part, and a supporting part; and mounting the supporting part as well.

* * * * *